(12) United States Patent
Alptekin et al.

(10) Patent No.: US 9,337,041 B2
(45) Date of Patent: May 10, 2016

(54) ANISOTROPIC DIELECTRIC MATERIAL GATE SPACER FOR A FIELD EFFECT TRANSISTOR

(71) Applicant: GLOBAL FOUNDRIES INC., Grand Cayman (KY)

(72) Inventors: Emre Alptekin, Wappingers Falls, NY (US); Hari V. Mallela, Poughquag, NY (US); Reinaldo Vega, Wappingers Falls, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 0 days.

(21) Appl. No.: 14/524,079

(22) Filed: Oct. 27, 2014

(65) Prior Publication Data

US 2015/0111350 A1    Apr. 23, 2015

Related U.S. Application Data

(62) Division of application No. 14/059,842, filed on Oct. 22, 2013.

(51) Int. Cl.
| | |
|---|---|
| *H01L 21/28* | (2006.01) |
| *H01L 29/772* | (2006.01) |
| *H01L 29/66* | (2006.01) |
| *H01L 29/49* | (2006.01) |
| *H01L 29/51* | (2006.01) |

(Continued)

(52) U.S. Cl.
CPC .. *H01L 21/28008* (2013.01); *H01L 21/823468* (2013.01); *H01L 21/84* (2013.01); *H01L 27/088* (2013.01); *H01L 27/1203* (2013.01); *H01L 29/4966* (2013.01); *H01L 29/517* (2013.01); *H01L 29/6653* (2013.01); *H01L 29/6656* (2013.01); *H01L 29/66545* (2013.01); *H01L 29/66628* (2013.01); *H01L 29/772* (2013.01)

(58) Field of Classification Search
None
See application file for complete search history.

(56) References Cited

U.S. PATENT DOCUMENTS

| | | | |
|---|---|---|---|
| 4,435,047 A | * | 3/1984 | Fergason ........................ 349/86 |
| 4,769,686 A | | 9/1988 | Horiuchi et al. |

(Continued)

OTHER PUBLICATIONS

Ratna, et al., "Dielectric Propertied of 4'-n-alkyl-4-cyanobiphenyls in their nematic phases" Pramana (1976) pp. 278-283, vol. 6, No. 5.

(Continued)

*Primary Examiner* — Shuan Campbell
*Assistant Examiner* — Aneta Cieslewicz
(74) *Attorney, Agent, or Firm* — Scully, Scott, Murphy & Presser, P.C.

(57) ABSTRACT

Capacitive coupling between a gate electrode and underlying portions of the source and drain regions can be enhanced while suppressing capacitive coupling between the gate electrode and laterally spaced elements such as contact via structures for the source and drain regions. A transistor including a gate electrode and source and drain regions is formed employing a disposable gate spacer. The disposable gate spacer is removed to form a spacer cavity, which is filled with an anisotropic dielectric material to form an anisotropic gate spacer. The anisotropic dielectric material is aligned with an electrical field such that lengthwise directions of the molecules of the anisotropic dielectric material are aligned vertically within the spacer cavity. The anisotropic gate spacer provides a higher dielectric constant along the vertical direction and a lower dielectric constant along the horizontal direction.

17 Claims, 11 Drawing Sheets

(51) Int. Cl.
*H01L 21/8234* (2006.01)
*H01L 21/84* (2006.01)
*H01L 27/088* (2006.01)
*H01L 27/12* (2006.01)

(56) References Cited

U.S. PATENT DOCUMENTS

| | | |
|---|---|---|
| 7,544,556 B1 | 6/2009 | Mui et al. |
| 2001/0050396 A1 | 12/2001 | Esaki |
| 2004/0041196 A1 | 3/2004 | Wieczorek et al. |
| 2006/0220090 A1 | 10/2006 | Metz et al. |
| 2008/0258225 A1 | 10/2008 | Yang et al. |
| 2009/0212332 A1 | 8/2009 | Wang et al. |
| 2013/0009257 A1* | 1/2013 | Ando et al. .................... 257/411 |
| 2013/0009562 A1 | 1/2013 | Vankan et al. |
| 2013/0178053 A1* | 7/2013 | Li et al. .......................... 438/586 |

OTHER PUBLICATIONS

Office Action dated Dec. 5, 2014 received in U.S. Appl. No. 14/059,842.
Office Action dated Sep. 22, 2015 received in U.S. Appl. No. 14/059,842.
Office Action dated May 14, 2015 received in U.S. Appl. No. 14/059,842.

* cited by examiner

ANISOTROPIC DIELECTRIC MATERIAL GATE SPACER FOR A FIELD EFFECT TRANSISTOR

BACKGROUND

The present disclosure generally relates to a semiconductor structure, and particularly to a field effect transistor employing a gate spacer having an anisotropic dielectric constant and a method of manufacturing the same.

A gate spacer on a field effect transistor has conflicting requirements in terms of a dielectric constant. On one hand, a strong coupling is desirable between a gate electrode and each of a source extension region and a drain extension region. To increase coupling with the source and drain extension regions (or portions of the source region and the drain region that underlap the gate spacer), it is desirable to have a high dielectric constant for a gate spacer. On the other hand, a weak coupling is desirable between the gate electrode and each of source/drain contact via structures and portions of the source and drain regions that do not underlap with the gate spacer. To reduce coupling with the source/drain contact via structures and portions of the source and drain regions that do not underlap with the gate electrode, it is desirable to have a low dielectric constant for the gate spacer. As known in the art, a single dielectric material having an isotropic dielectric constant is selected for the gate spacer such that the dielectric constant of the dielectric material is an optimized value. Typically, silicon nitride having a dielectric constant of 7.9 is selected as the dielectric material of the gate spacer.

SUMMARY

Capacitive coupling between a gate electrode and underlying portions of the source region and the drain region can be enhanced while suppressing capacitive coupling between the gate electrode and laterally spaced elements such as contact via structures for the source region and the drain region and portions of the source and drain regions that do not undelap with the gate electrode. A transistor including a gate electrode and source and drain regions is formed employing a disposable gate spacer. The disposable gate spacer is removed to form a spacer cavity, which is filled with an anisotropic dielectric material to form an anisotropic gate spacer. The anisotropic dielectric material is aligned with an electrical field such that lengthwise directions of the molecules of the anisotropic dielectric material are aligned vertically within the spacer cavity. The anisotropic gate spacer provides a higher dielectric constant along the vertical direction and a lower dielectric constant along the horizontal direction.

According to an aspect of the present disclosure, a semiconductor structure containing a field effect transistor is provided. The field effect transistor includes a body region laterally contacted by a source region and a drain region, a gate dielectric contacting the body region, a gate electrode contacting the gate dielectric, and a gate spacer including an anisotropic dielectric material having an anisotropic dielectric constant and laterally surrounding the gate electrode.

According to another aspect of the present disclosure, a method of forming a semiconductor structure is provided. A body region, a source region, and a drain region are formed within a semiconductor material portion on a substrate. The source region and the drain region are laterally spaced from each other by the body region. A disposable gate spacer is formed over a portion of the source region and a portion of the drain region. A gate structure including a gate dielectric and a gate electrode is formed over the body region. The disposable gate spacer is replaced with a gate spacer including an anisotropic dielectric material having an anisotropic dielectric constant. The gate spacer laterally surrounding the gate electrode.

DETAILED DESCRIPTION

As stated above, the present disclosure relates to a field effect transistor employing a gate spacer having an anisotropic dielectric constant and a method of manufacturing the same. Aspects of the present disclosure are now described in detail with accompanying figures. Like and corresponding elements mentioned herein and illustrated in the drawings are referred to by like reference numerals. The drawings are not necessarily drawn to scale. As used herein, ordinals are employed merely to distinguish similar elements, and different ordinals may be employed to designate a same element in the specification and/or claims.

Figure 1:
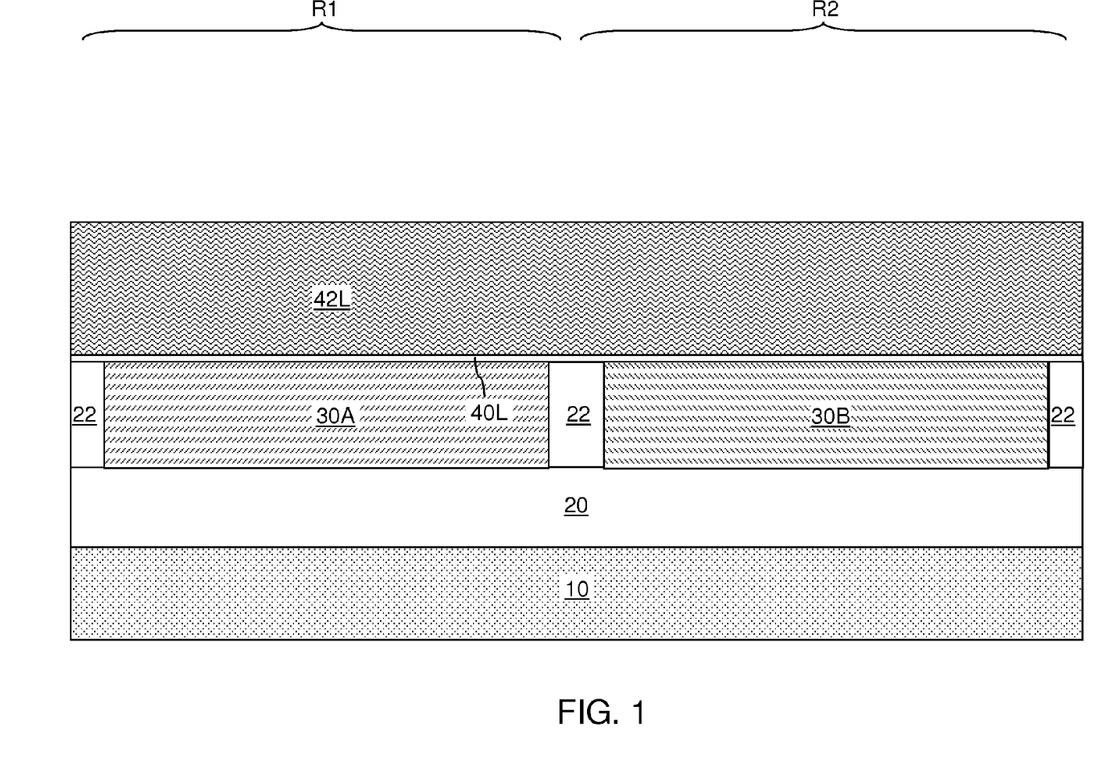
FIG. 1 is a vertical cross-sectional view of an exemplary semiconductor structure after formation of a disposable gate dielectric layer and a disposable gate material layer according to an embodiment of the present disclosure.

Referring to FIG. 1, an exemplary semiconductor structure according to an embodiment of the present disclosure includes a semiconductor substrate, which can be a semiconductor-on-insulator (SOI) substrate, a bulk substrate, or a hybrid substrate including a bulk portion and an SOI portion. In one embodiment, the substrate can be an SOI substrate including a stack, from bottom to top, of a handle substrate 10, a buried insulator layer 20, and a top semiconductor layer.

The handle substrate 10 can include a semiconductor material, a conductive material, or a dielectric material, and provides mechanical support to the buried insulator layer 20 and the top semiconductor layer. The thickness of the handle substrate 10 can be from 50 microns to 2 mm, although lesser and greater thicknesses can also be employed. The buried insulator layer 20 includes a dielectric material such as silicon oxide, silicon nitride, silicon oxynitride or a combination thereof. The thickness of the buried insulator layer 20 can be from 10 nm to 1,000 nm, although lesser and greater thicknesses can also be employed.

The top semiconductor layer includes a semiconductor material, which can be an elemental semiconductor material such as silicon or germanium, an alloy of at least two elemental semiconductor materials such as a silicon-germanium alloy, a compound semiconductor material, or any other semiconductor material known in the art. The thickness of the top semiconductor layer can be from 30 nm to 600 nm, although lesser and greater thicknesses can also be employed. The top semiconductor layer can include a single crystalline semiconductor material, a polycrystalline semiconductor material, or an amorphous semiconductor material. Various portions of the top semiconductor layer may be doped with electrical dopants. An "electrical dopant" refers to a dopant that introduces free electrical charges in a semiconductor material, and can be a p-type dopant or an n-type dopant. Exemplary p-type dopants include B, Ga, and In, and exemplary n-type dopants include P, As, and Sb. Different portions of the top semiconductor layer may include different semiconductor materials. In one embodiment, the top semiconductor layer includes a single crystalline semiconductor material such as single crystalline silicon and/or a single crystalline silicon-germanium alloy.

The top semiconductor layer can be is patterned to form a plurality of semiconductor material portions. The plurality of semiconductor material portions can include, for example, a first semiconductor material portion 30A formed in a first device region R1 and a second semiconductor material portion 30B formed in a second device region R2. In one embodiment, the first semiconductor material portion 30A can have a doping of a first conductivity type, and the second semiconductor material portion 30B can have a doping of a second conductivity type that is the opposite of the first conductivity type. For example, the first conductivity type can be p-type and the second conductivity type can be n-type, or vice versa. Additional semiconductor material portions (not shown) having different types of doping, thickness, and/or semiconductor material, can be formed as needed. Alternately, at least one of the first and second semiconductor material portions (30A, 30B) can be an intrinsic semiconductor material portion.

The formation of the semiconductor material portions (30A, 30B) by patterning of a semiconductor material layer can be performed, for example, by a combination of a lithographic method and an anisotropic etch. The buried insulator layer 20 can be employed as a stopping layer for the anisotropic etch. The plurality of semiconductor material portions (30A, 30B) can be formed directly on the top surface of the buried insulator layer 20.

In one embodiment, the semiconductor material portions (30A, 30B) can be patterned as planar active semiconductor regions for forming planar field effect transistors. As used herein, a "planar field effect transistor" refers to a field effect transistor in which a predominant portion of the interface between the body region and the gate dielectric is at least one horizontal surface. In this case, shallow trench isolation structures 22 including a dielectric material can be formed within the top semiconductor layer 20, for example, by filling shallow trenches that separate each semiconductor material portion (30A, 30B) with a dielectric material, and by removing excess portions of the dielectric material from above the top surfaces of the semiconductor material portions (30A, 30B).

In another embodiment, the semiconductor material portions (30A, 30B) can be semiconductor fins that can be employed to form fin field effect transistors. As used herein, a "fin field effect transistor" refers to a field effect transistor in which a predominant portion of the interface between the body region and the gate dielectric is at least one vertical surface. In this case, the semiconductor fins can be located on the top surface of the buried insulator layer 20, and the semiconductor fins can be laterally spaced from one another by gaps. Each semiconductor fin includes a parallel pair of substantially vertical sidewalls that extend along a lengthwise direction of the semiconductor fin. As used herein, a "lengthwise direction" of an object refers to a direction about which the moment of inertia of the object becomes the minimum. Each semiconductor fin laterally extends along a fin direction, which is the lengthwise direction of the semiconductor fin. Shallow trench isolation structures may not be present in this case, or top surfaces of shallow trench isolation structures 22 may be recessed below the topmost surfaces of the semiconductor fins so that sidewalls of the semiconductor fins are physically exposed.

If a bulk substrate is employed in lieu of an SOI substrate, the semiconductor material portions (30A, 30B) formed by an anisotropic etch can be electrically isolated from one another by forming shallow trench isolation structures 22 including a dielectric material and/or by forming doped wells that can be employed to form reverse biased p-n junctions. If the semiconductor material portions (30A, 30B) on a bulk substrate are to be employed as semiconductor fins, top surfaces of the shallow trench isolation structures 22 can be recessed relative to the top surfaces of the semiconductor fins, i.e., the top surfaces of the semiconductor material portions (30A, 30B).

A disposable gate dielectric layer 40L can be formed on the top surface of the semiconductor substrate, i.e., on the surfaces of the semiconductor material portions (30A, 30B). The disposable gate dielectric layer 40L includes a dielectric material such as silicon oxide, silicon nitride, silicon oxynitride, a dielectric metal oxide having a dielectric constant greater than 8.0, an organosilicate glass (OSG), or any other dielectric material that can function as a stopping layer during removal of disposable gate materials to be deposited on the disposable gate dielectric layer 40L. The disposable gate dielectric layer 40L can be formed, for example, by chemical vapor deposition (CVD), atomic layer deposition (ALD), conversion of surface portions of the semiconductor material portions (30A, 30B) into a dielectric material, or a combination thereof. The thickness of the disposable gate dielectric layer 40L can be, for example, from 1 nm to 30 nm, although lesser and greater thicknesses can also be employed. The disposable gate dielectric layer 40L is optional, i.e., may, or may not, be present as long as etch chemistries for removing disposable gate materials selective to the semiconductor materials of the semiconductor material portions (30A, 30B) exists.

A disposable gate material layer 42L is deposited over the disposable gate dielectric layer. The disposable gate material layer 42L includes a disposable gate material, which can be a semiconductor material or a metallic material. The disposable gate material layer 42L can be deposited, for example, by chemical vapor deposition (CVD), physical vapor deposition (PVD), vacuum evaporation, or any other deposition method for deposition a semiconductor material or a metallic material. The disposable gate material layer 42L can be deposited in the first and second device regions (R1, R2) simultaneously. The thickness of the disposable gate material layer 42L can be about, or greater than, the height of replacement gate stack structures to be subsequently formed. In one embodiment, the thickness of the disposable gate material layer 42L can be from 30 nm to 600 nm, although lesser and greater thicknesses can also be employed. The disposable gate material layer 42L may be polycrystalline or amorphous.

In one embodiment, the disposable gate material layer 42L can include a semiconductor material, which can be a doped or undoped elemental semiconductor material, a doped or undoped alloy of at least two elemental semiconductor materials, or a doped or undoped compound semiconductor material. If the disposable gate material layer 42L includes a doped semiconductor material, the dopant atoms present within the doped semiconductor material may be p-type dopants or n-type dopants.

In another embodiment, the disposable gate material layer 42L can include a metallic material, which can be an elemental metal, an intermetallic alloy, a conductive metallic compound, or combinations of thereof. For example, the disposable gate material layer 42L can include one or more of Cu, Al, W, Ti, Ta, Ni, Co, TiN, TaN, WN, TiC, TaC, WC, and other conductive metallic materials.

In yet another embodiment, the disposable gate material layer 42L can include a dielectric material such as silicon nitride or organosilicate glass.

In still another embodiment, the disposable gate material layer 42L can include amorphous carbon or an organic material.

Figure 2:
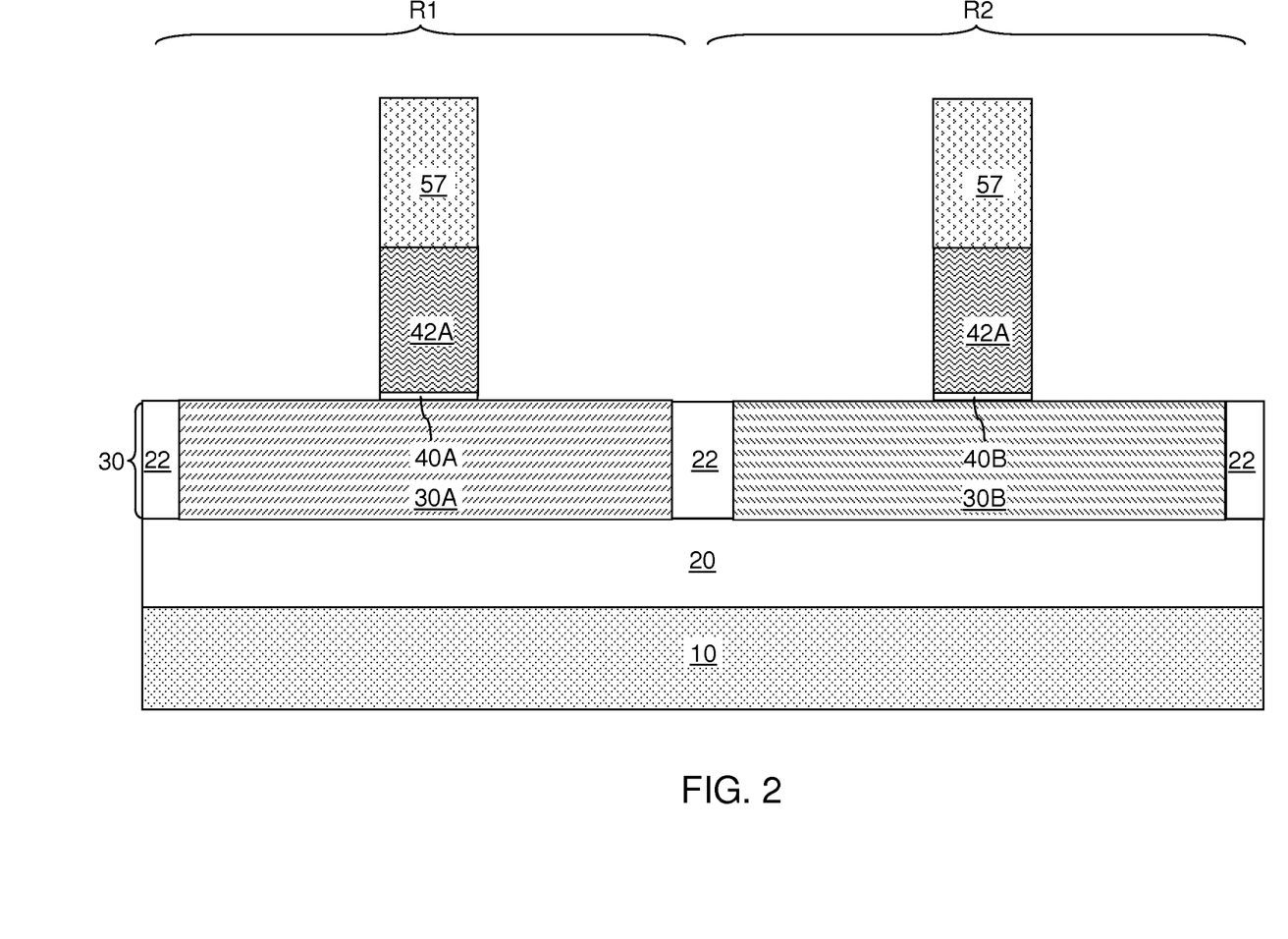
FIG. 2 is a vertical cross-sectional view of the exemplary semiconductor structure after patterning the disposable gate material layer and the disposable gate dielectric layer to form disposable gate structures according to an embodiment of the present disclosure.

Referring to FIG. 2, the disposable gate material layer 42L and the disposable gate dielectric layer 40L can be patterned to form a first disposable gate structure (40A, 42A) in the first device region R1 and a second disposable gate structure (40B, 42B) in the second device region R2. The first disposable gate structure (40A, 42A) includes a portion of the disposable gate material layer 42L (which is herein referred to as a first disposable gate material portion 42A) and a first portion of the disposable gate dielectric layer 40L (which is herein referred to as a first disposable gate dielectric portion 40A). The second disposable gate structure (40B, 42B) includes another portion of the disposable gate material layer 42L (which is herein referred to as a second disposable gate material portion 42B) and a second portion of the disposable gate dielectric layer 40L (which is herein referred to as a second disposable gate dielectric portion 40B). The first disposable gate structure (40A, 42A) and the second disposable gate structure (40B, 42B) can be formed in the first device region R1 and in the second device region R2, respectively, on the semiconductor substrate (10, 20, 30).

The patterning of the disposable gate material layer 42L and the disposable gate dielectric layer 40L can be performed, for example, by applying a photoresist layer 57 over the disposable gate material layer 42L, lithographically patterning the photoresist layer 57, and transferring the pattern in the photoresist layer 57 through the disposable gate material layer 42L and the disposable gate dielectric layer 40L by an anisotropic etch that employs remaining portions of the photoresist layer 57 as an etch mask. The remaining portions of the photoresist layer 57 can be removed, for example, by ashing.

Figure 3:
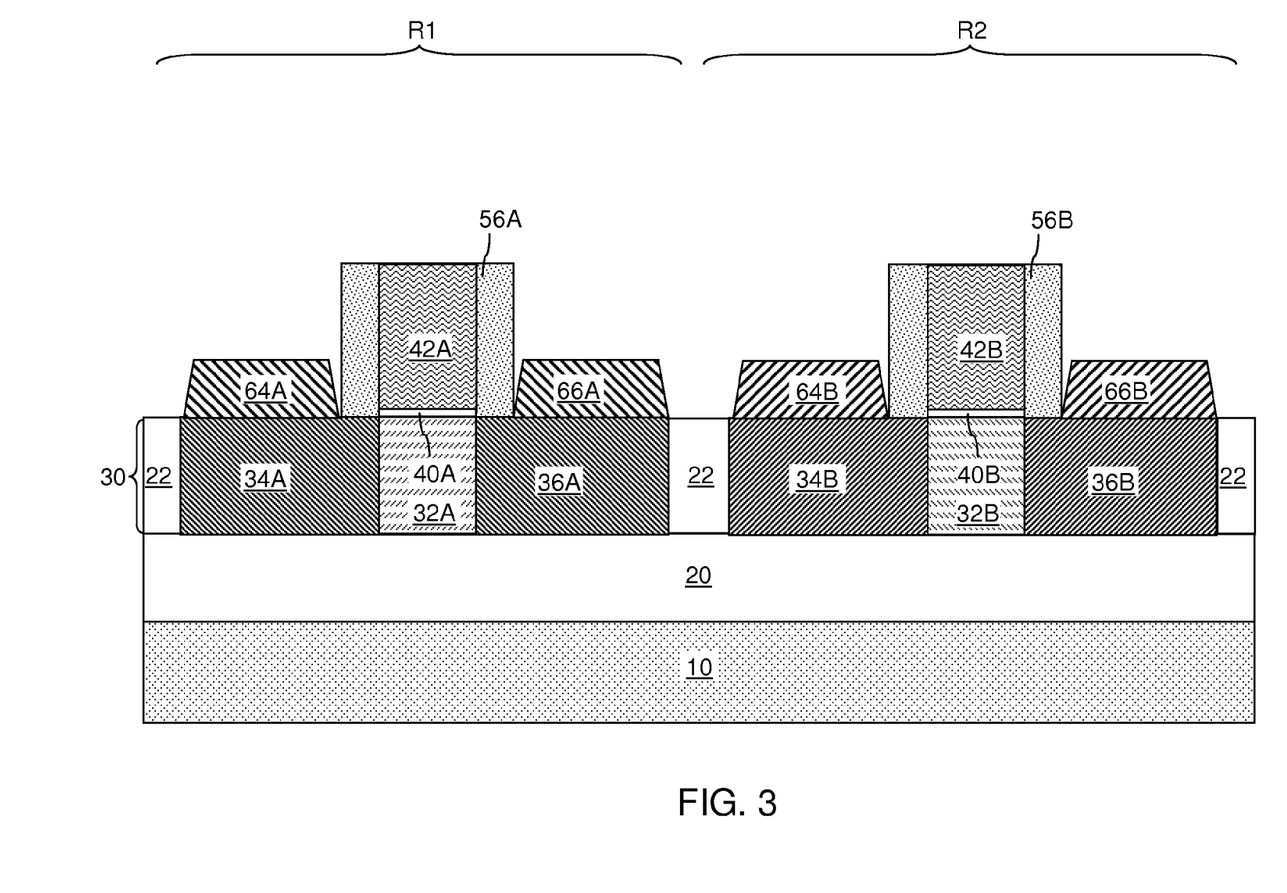
FIG. 3 is a vertical cross-sectional view of the exemplary semiconductor structure after formation of source regions, drain regions, body regions, disposable gate spacers, and optional raised source and drain regions according to an embodiment of the present disclosure.

Referring to FIG. 3, source regions (34A, 34B) and drain regions (36A, 36B) can be formed in the first semiconductor material portion 30A and the second semiconductor material portion 30B, respectively, by at least one ion implantation process. Implantation masks may be optionally employed to confine regions in which dopant ions (which can be p-type dopants or n-type dopants) are implanted into the top semiconductor layer 30. Unimplanted portions of the first and second semiconductor material portions (30A, 30B) are herein referred to as a first body region 32A and a second body region 32B, respectively.

Disposable gate spacers (56A, 56B) can be simultaneously formed around each of the first and second disposable gate structures (40A, 42A; 40B, 42B). A p-n junction, a p-i junction (a junction between a p-doped semiconductor material and an intrinsic semiconductor material), or an n-i junction (a junction between an n-doped semiconductor material and an intrinsic semiconductor material) can be formed at an interface between each body region (32A, 32B) and a neighboring source region (34A, 34B) or a neighboring drain region (36A, 36B). The disposable gate spacers (56A, 56B) can be employed to adjust the location of the p-n junctions, the p-i junctions, and/or the n-i junctions. In one embodiment, the first disposable gate spacer 56A can be formed around the first disposable gate structure (40A, 42A) and the second disposable gate spacer 56B can be formed around the second disposable gate structure (40B, 42B).

The first and second disposable gate spacers (56A, 56B) can be formed simultaneously by deposition of a conformal material layer and an anisotropic etch. The conformal material layer includes a material that is different from the material of the disposable gate material portions (42A, 42B), can be deposited conformally, and can be removed selective to the materials of a planarization dielectric layer to be subsequently formed and selective to the semiconductor material of the source and drain regions (34A, 34A, 34B, 36B).

In one embodiment, the first and second disposable gate spacers (56A, 56B) can include a dielectric material such as silicon nitride or organosilicate glass.

In another embodiment, the first and second disposable gate spacers (56A, 56B) can include a semiconductor material such as a doped or undoped elemental semiconductor material, a doped or undoped alloy of at least two elemental semiconductor materials, or a doped or undoped compound semiconductor material.

In yet another embodiment, the first and second disposable gate spacers (56A, 56B) can include a metallic material, which can be an elemental metal, an intermetallic alloy, a conductive metallic compound, or combinations of thereof. For example, the first and second disposable gate spacers (56A, 56B) can include one or more of Cu, Al, W, Ti, Ta, Ni, Co, TiN, TaN, WN, TiC, TaC, WC, and other conductive metallic materials.

In still another embodiment, the first and second disposable gate spacers (56A, 56B) can include amorphous carbon or an organic material.

Optionally, raised source regions (64A, 64B) and raised drain regions (66A, 66B) can be formed on the source regions (34A, 34B) and the drain regions (36A, 36B), respectively. The raised source regions (64A, 64B) and the raised drain regions (66A, 66B) can be formed, for example, by selective epitaxy of at least one semiconductor material, which can be the same as, or can be different from, any of the semiconductor material(s) in the source regions (34A, 34B) and/or the drain regions (36A, 36B). The raised source regions (64A, 64B) and the raised drain regions (66A, 66B) can be formed with in-situ doping, or may be doped after selective epitaxy by ion implantation or plasma doping.

Figure 4:
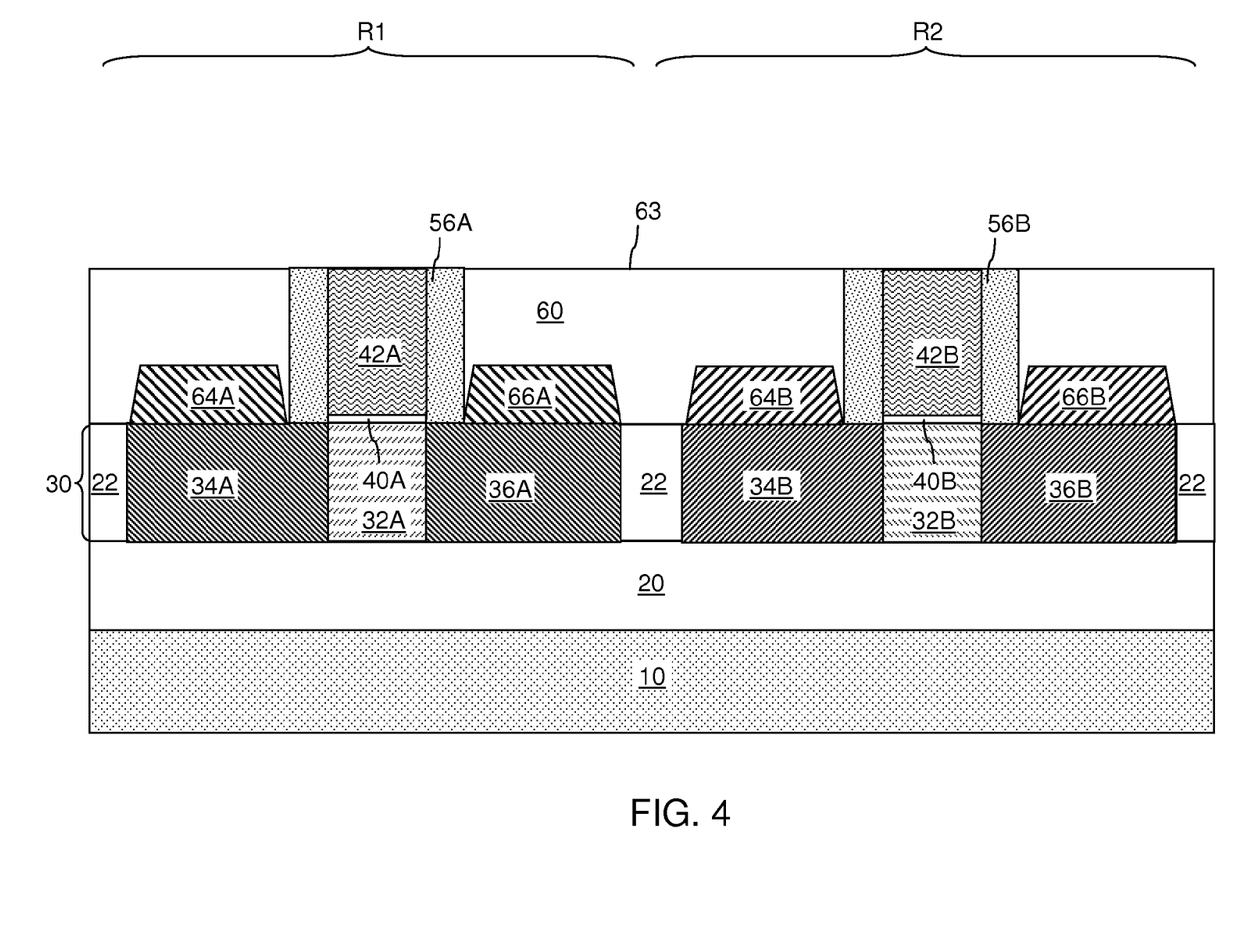
FIG. 4 is a vertical cross-sectional view of the exemplary semiconductor structure after formation of a planarization dielectric layer according to an embodiment of the present disclosure.

Referring to FIG. 4, an isotropic dielectric material is deposited over the first and second disposable gate structures (40A, 42A; 40B, 42B). As used herein, an "isotropic dielectric material" refers to a dielectric material of which the dielectric constant is isotropic, i.e., orientation-independent. In other words, the dielectric constant of an isotropic dielectric material has the same value irrespective of the orientation along which the dielectric constant is measured. The layer of the deposited dielectric material is herein referred to as a planarization dielectric layer 60.

The isotropic dielectric material of the planarization dielectric layer 60 can be, for example, doped or undoped silicon oxide, silicon nitride, silicon oxynitride, or a combination thereof. The isotropic dielectric material of the planarization dielectric layer 60 is selected to be different from the materials of the disposable gate material portions (42A, 42B) and the disposable gate spacers (56A, 56B). Further, the dielectric material of the planarization dielectric layer 60 is selected such that a set of two selective etch chemistries exist. The set of two selective etch chemistries include a first selective etch chemistry for selectively etching the material of the disposable gate material portions (42A, 42B) without substantially etching the materials of the planarization dielectric layer 60 and the disposable gate spacers (56A, 56B). Further, the set of two selective etch chemistries include a second selective etch chemistry for selectively etching the material of the disposable gate spacers (56A, 56B) without substantially etching the materials of the planarization dielectric layer 60 and the materials of replacement gate structures to subsequently replace the disposable gate structures (40A, 42A; 40B, 42B). As used herein, a "selective etch" refers to an etch that etches one material without substantially etching other materials. As used herein, an etch of a second material during etching of a first material is "substantial" if the etch rate of the second material is greater than 20% of the etch rate of the first material.

In a non-limiting exemplary illustration, the source and drain regions (34A, 36A) can include silicon or a silicon-containing semiconductor material in which atomic concentration of silicon is at least 80%, the planarization dielectric layer 60 can include silicon oxide, the disposable gate material portions (42A, 42B) can include germanium or a silicon germanium alloy that can be removed by a wet etch employing a combination of ammonium hydroxide and optionally hydrogen peroxide, and the disposable gate spacers (56A, 56B) can include silicon nitride or a metallic nitride that can be removed selective to silicon oxide and the silicon containing semiconductor material.

The planarization dielectric layer 60 can be deposited, for example, by chemical vapor deposition (CVD) or spin-coating. The thickness of the planarization dielectric layer 60 as deposited can be controlled such that all portions of the top surface of the planarization dielectric layer 60 are located at, or above, top surfaces of the first and second disposable gate structures (40A, 42; 40B, 48). The planarization dielectric layer 60 is subsequently planarized. Top surfaces of the first and second disposable gate structures (40A, 42A; 40B, 42B) are physically exposed by the planarization of the planarization dielectric layer 60. In one embodiment, the disposable gate material portions (42A, 42B) can be employed as an endpoint layer during the planarization. After the planarization of the planarization dielectric layer 60, a planar dielectric surface 63 of the planarization dielectric layer 60 can be coplanar with each top surface of the first and second disposable gate structures (40A, 42A; 40B, 42B) and the top surfaces of the disposable gate spacers (56A, 56B).

Figure 5:
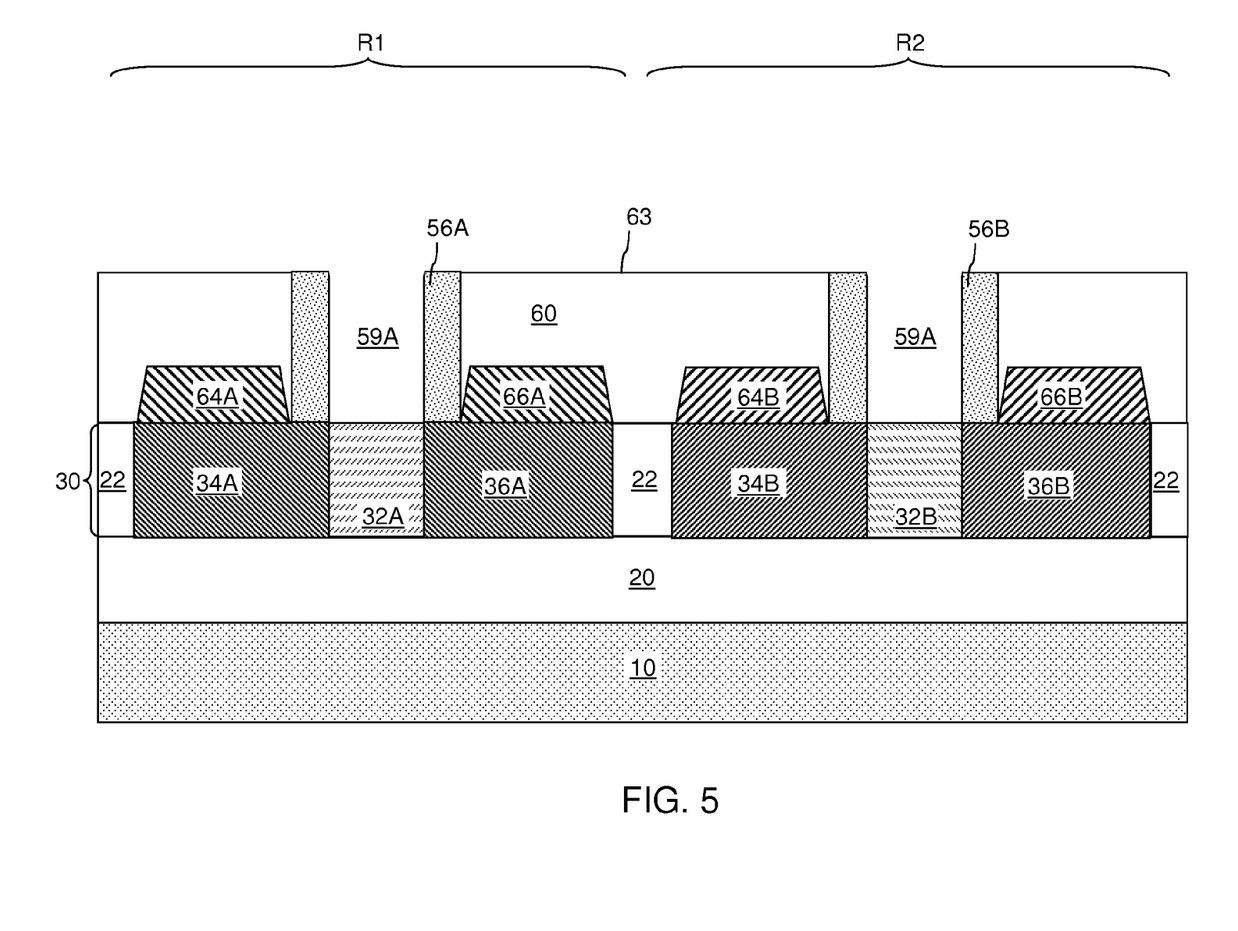
FIG. 5 is a vertical cross-sectional view of the exemplary semiconductor structure after removal of the disposable gate structures to form gate cavities according to an embodiment of the present disclosure.

Referring to FIG. 5, the disposable gate structures (40A, 42A, 40B, 42B; See FIG. 4) are removed selective to the planarization dielectric layer 60 and the semiconductor material of the body regions (32A, 32B) to form gate cavities (59A, 59B). The selective removal of the disposable gate structures (40A, 42A, 40B, 42B) can be performed, for example, by an isotropic etch such as a wet etch. In an illustrative example, if the disposable gate material portions (42A, 42B) include germanium or a germanium-containing alloy, a wet etch employing ammonium hydroxide and optionally hydrogen peroxide can be employed. If the disposable gate material portions (42A, 42B) include amorphous carbon or an organic material, ashing in a vacuum environment can be employed. The disposable gate dielectric portions (40A, 40B) can be employed, for example, by a wet etch employing hydrofluoric acid. A first gate cavity 59 laterally surrounded by the first disposable gate spacer 56A is formed in the first device region R1, and a second gate cavity laterally surrounded by the second disposable gate spacer 56B is formed in the second device region R2.

Figure 6:
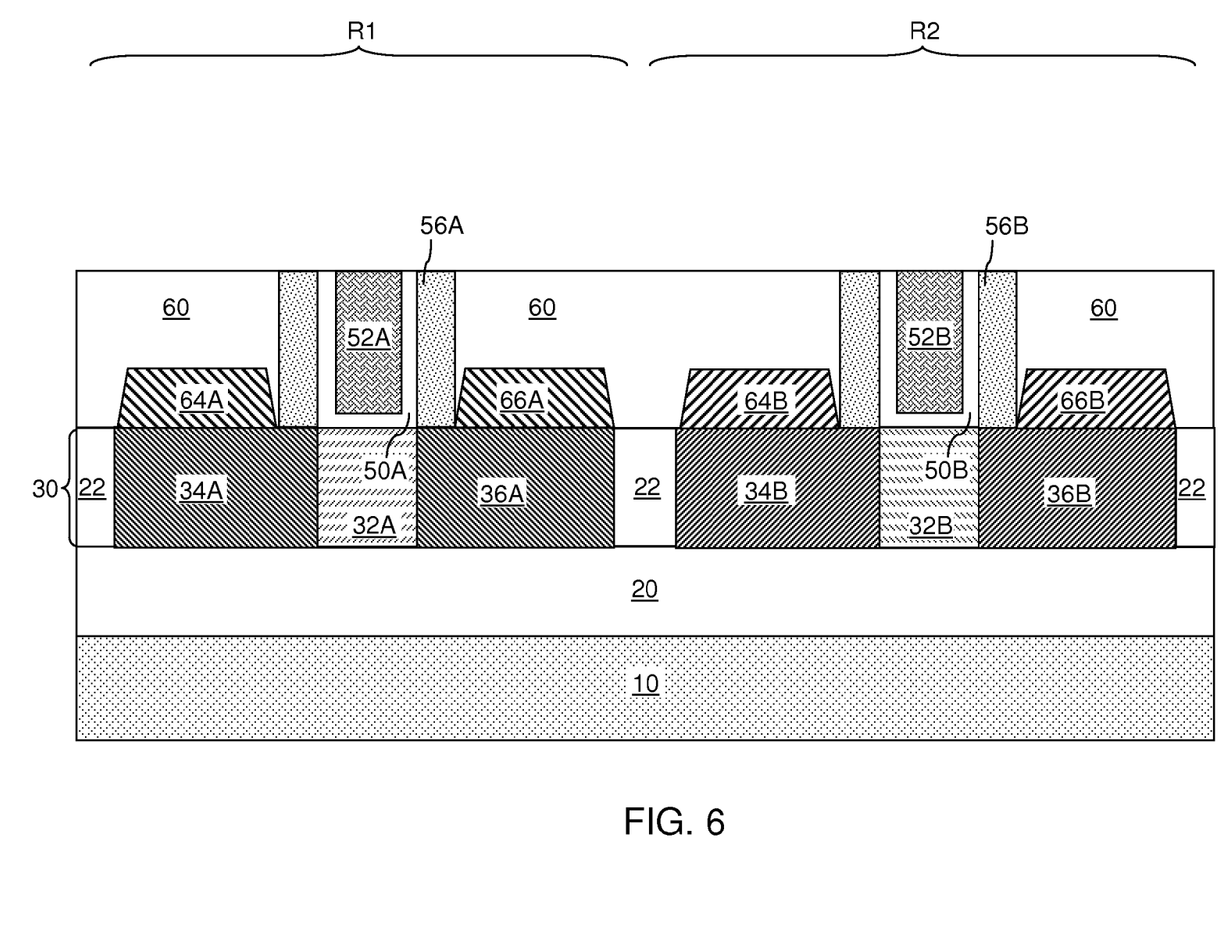
FIG. 6 is a vertical cross-sectional view of the exemplary semiconductor structure after formation of replacement gate structures according to an embodiment of the present disclosure.

Referring to FIG. 6, the gate cavities (59A, 59B; See FIG. 5) are filled with replacement gate material layers. The replacement gate material layers can include, for example, a gate dielectric material layer and at least one gate electrode material layer.

In one embodiment, the gate dielectric material layer can include a chemical oxide layer as known in the art. The gate dielectric material layer can further include a dielectric metal oxide having a dielectric constant greater than 8.0 and/or a dielectric material including a semiconductor atom such as silicon oxide, silicon nitride, and silicon oxynitride. The gate dielectric material layer can be formed, for example, by atomic layer deposition (ALD), chemical vapor deposition (CVD), and/or conversion of surface portions of a semiconductor material underlying the gate cavities (59A, 59B) by oxidation, nitridation, or combinations thereof.

In one embodiment, the at least one gate electrode material layer can include any workfunction material as known in the art. Exemplary workfunction materials include, but are not limited to, TiN, TaN, WN, Ti, Ta, and W. Alternatively or additionally, the at least one gate electrode material can include a doped semiconductor material such as doped polysilicon or a doped silicon-germanium alloy. The at least one gate electrode material layer can be deposited, for example, by chemical vapor deposition (CVD), physical vapor deposition (PVD), atomic layer deposition (ALD), or a combination thereof.

Excess portions of the gate dielectric material layer and the at least one gate electrode material layer can be removed from above the top surface of the planarization dielectric layer 60 by a planarization process, which can employ, for example, chemical mechanical planarization (CMP). Remaining portions of the gate dielectric material layer within the gate cavities (589A, 59B) constitute a first gate dielectric 50A in the first device region R1 and a second gate dielectric 50B in the second device region R2. Remaining portions of the at least one gate electrode material layer within the gate cavities (589A, 59B) constitutes a first gate electrode 52A in the first device region R1 and a second device region R2. The first gate dielectric 50A and the first gate electrode 52A collectively fill the first gate cavity 59A and constitute a first replacement gate structure, i.e., a gate structure that replaces the first disposable gate structure (40A, 42A; See FIG. 4). The second gate dielectric 50B and the second gate electrode 52B collectively fill the second gate cavity 59B and constitute a second replacement gate structure, i.e., a gate structure that replaces the second disposable gate structure (40B, 42B; See FIG. 4).

While the present disclosure is illustrated employing an embodiment in which the first and second disposable gate structures (40A, 42A; 40B, 42B) are simultaneously replaced, embodiments in which the first and second disposable gate structures (40A, 42A; 40B, 42B) are sequentially replaced with replacement gate structures having different compositions are also expressly contemplated.

Figure 7:
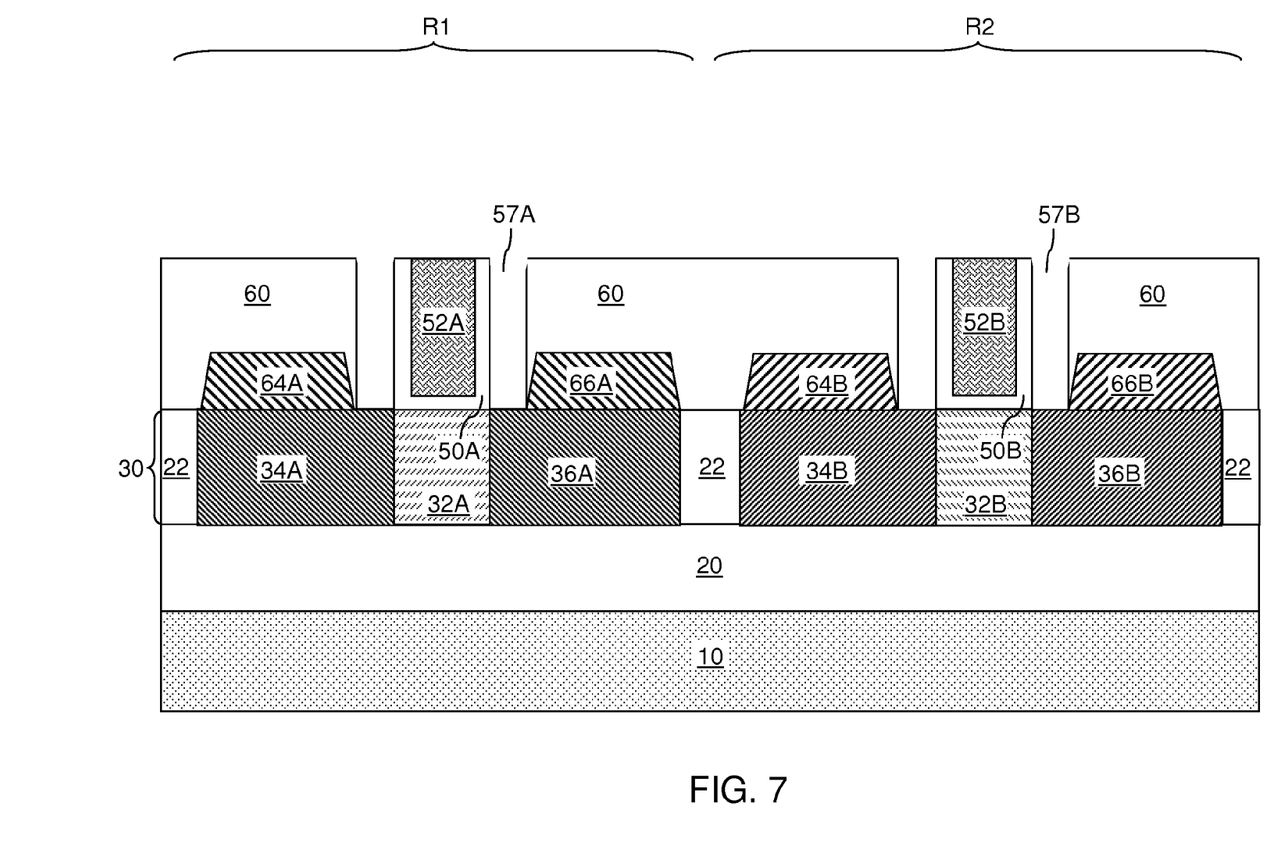
FIG. 7 is a vertical cross-sectional view of the exemplary semiconductor structure after removal of disposable gate spacers to form gate spacer cavities according to an embodiment of the present disclosure.
Figure 7A:
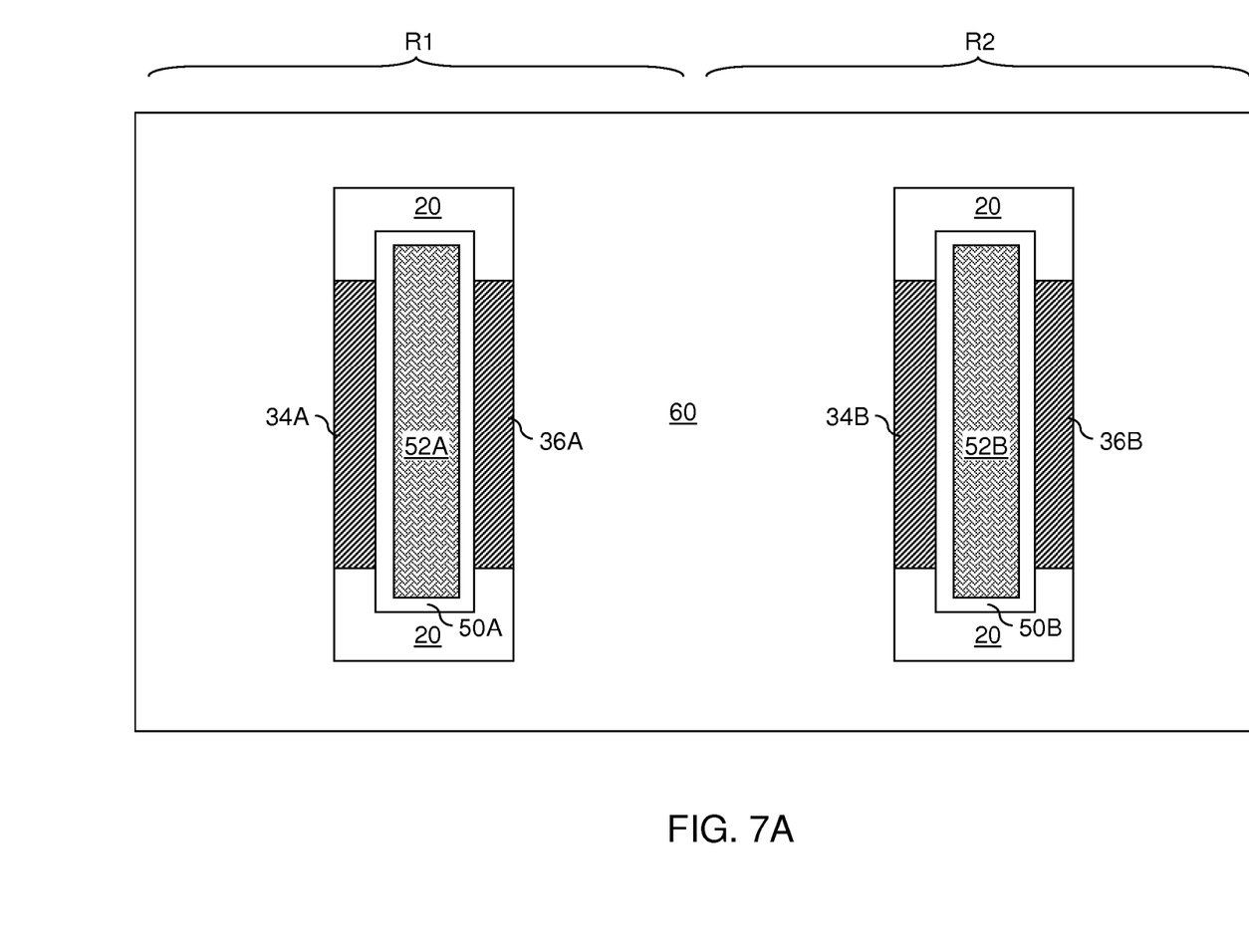
FIG. 7A is a top-down view of the exemplary semiconductor structure of FIG. 7.

Referring to FIGS. 7A and 7B, disposable gate spacers (56A, 56B) are removed selective to the isotropic dielectric material of the planarization dielectric layer 60 and the semiconductor material of the source and drain regions (34A, 36A, 34B, 36B) to form gate spacer cavities (57A, 57B). The removal of the material of the disposable gate spacers (56A, 56B) can be performed by an isotropic etch or an anisotropic etch. For example, if the disposable gate spacers (56A, 56B) include silicon nitride and if the planarization dielectric layer 60 includes silicon oxide, a wet etch employing hot phosphoric acid can be employed to remove the disposable gate spacers (56A, 56B) selective to the planarization dielectric layer 60 and the source and drain regions (34A, 36A, 34B, 36B).

Figure 8:
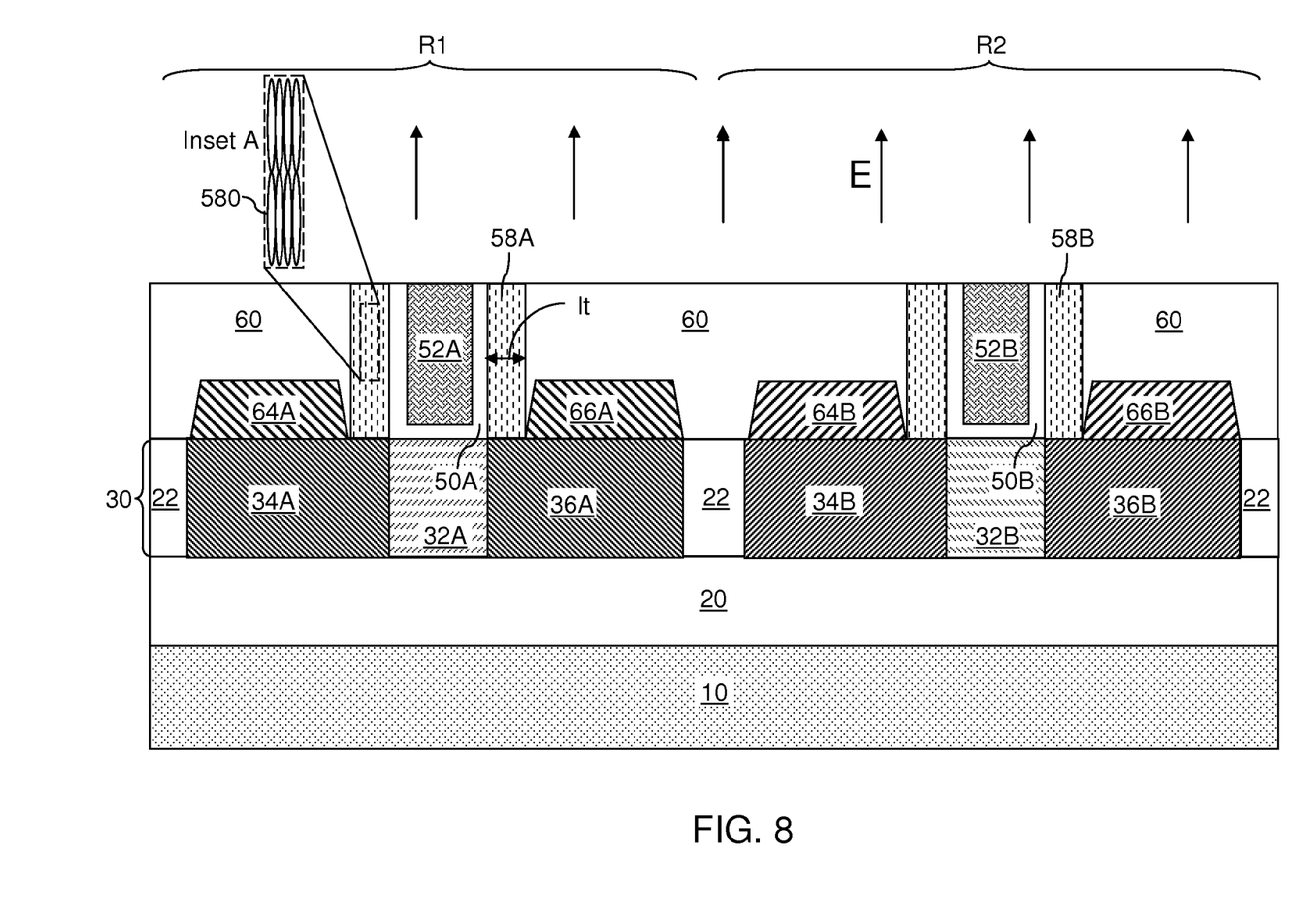
FIG. 8 is a vertical cross-sectional view of the exemplary semiconductor structure after formation of gate spacers including an anisotropic dielectric material according to an embodiment of the present disclosure.
Figure 8A:
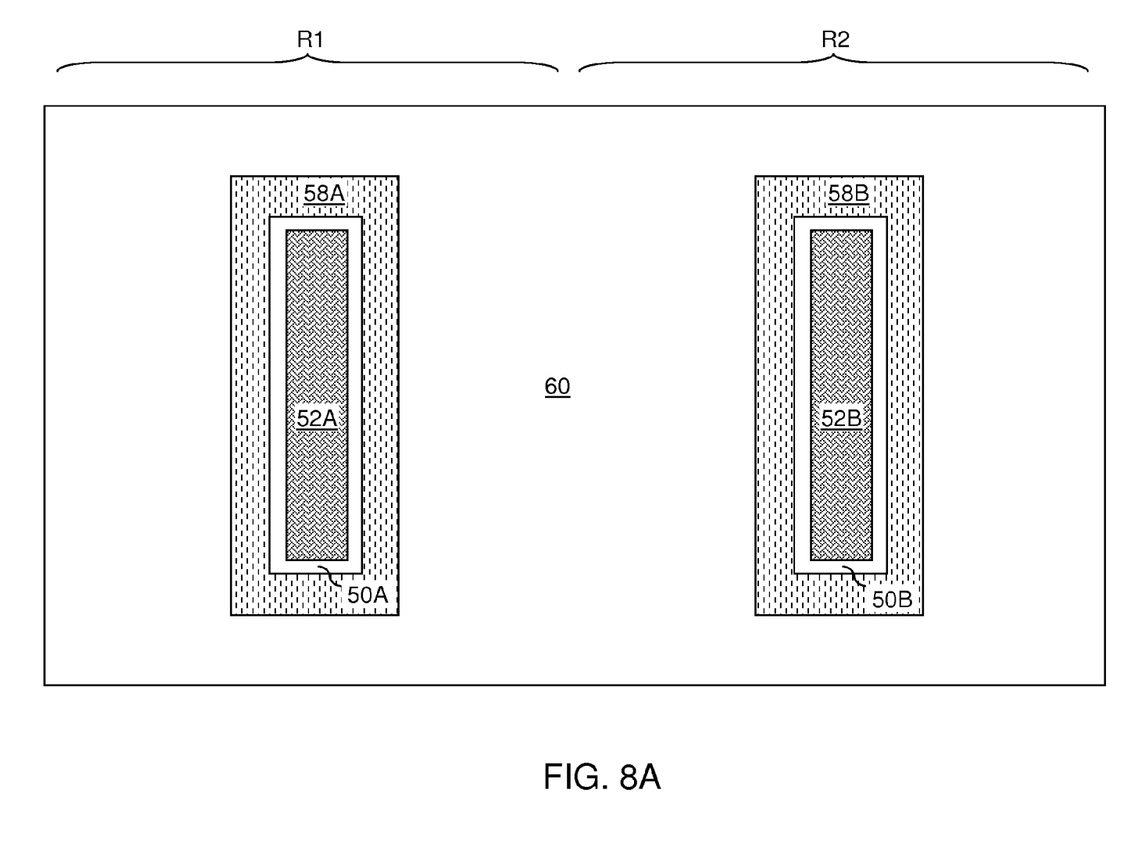
FIG. 8A is a top-down view of the exemplary semiconductor structure of FIG. 8.

Referring to FIGS. 8 and 8A, gate spacers (58A, 58B) including an anisotropic dielectric material are formed by filling the gate spacer cavities (57A, 57B) with the anisotropic dielectric material. As used herein, an "anisotropic dielectric material" refers to a dielectric material having an anisotropic dielectric constant, i.e., a material of which the value of the dielectric constant is dependent upon the orientation along which the dielectric constant is measured. Thus, the dielectric "constant" of an anisotropic dielectric material is given as a second rank tensor that correlates a vector representing an applied electrical field and another vector representing an electric displacement field within the anisotropic dielectric material.

In one embodiment, the anisotropic dielectric material can be a liquid crystal material. As used herein, a "liquid crystal material" refers to a matter in a state that may flow like a liquid while maintaining the same molecular orientation among the molecules within each domain therein. In one embodiment, the anisotropic dielectric material can be a liquid crystal material in a nematic phase. As used herein, a "nematic phase" refers to a phase a liquid crystal material in which the molecules of the liquid crystal material does not have positional order, but are self-align to have long-range directional order with their long axes roughly parallel. In a nematic phase, the molecules of a liquid crystal material are free to flow and their center of mass positions are randomly distributed as in a liquid, but still maintain their long-range directional order. Nematic phase liquid crystal materials may be uniaxial, i.e., have one axis that is longer and preferred, with the other two being equivalent.

Nematic phase liquid crystal materials can be easily aligned by an external magnetic or electric field. Aligned nematic phase liquid crystal materials have anisotropic dielectric constants. In many cases, the second rank tensor representing the dielectric constant of the anisotropic dielectric material is a 3×3 diagonal tensor. Thus, the value of the dielectric constant of an anisotropic dielectric material along the lengthwise direction of the molecules of a nematic phase liquid crystal material may be represented by a scalar. Also, in many case, the value of the dielectric constant of an anisotropic dielectric material along a direction perpendicular to the lengthwise direction of the molecules of a nematic phase liquid crystal material may also be represented by another scalar. Typically, the value of the dielectric constant along the lengthwise direction of the molecules of a nematic phase liquid crystal material is greater than the value of the dielectric constant measured along a direction perpendicular to the lengthwise direction of the molecules of the nematic phase liquid crystal material.

The gate spacers (58A, 58B) can be formed, for example, by pouring the anisotropic dielectric material in liquid phase into the gate cavities (57A, 57B). The anisotropic dielectric material can be poured with, or without, spin-coating. Excess anisotropic dielectric material can be removed from the top surface of the planarization dielectric layer 60, for example, by sweeping or spinning of the substrate (10, 20, 30).

In one embodiment, an electrical field or a magnetic field may be applied along a vertical direction that is perpendicular to the interface between the body regions (32A, 32B) and the gate dielectrics (50A, 50B) while pouring the anisotropic dielectric material or after pouring the anisotropic dielectric material so as to induce the vertical alignment of the lengthwise direction of the molecules of the nematic phase liquid crystal material with the vertical direction. The alignment of the molecules 580 of a nematic phase liquid crystal material within the volumes of the gate spacers (58A, 58B) is illustrated in inset A. If an electrical field is employed to align the molecules of the nematic phase liquid crystal material, the magnitude of the applied electrical field can be in a range from $10^5$ V/cm to $10^7$ V/cm, although lesser and greater magnitudes of the applied electrical field may be employed. If a magnetic field is employed to align the molecules of the nematic phase liquid crystal material, the magnitude of the applied magnetic field can be in a range from 0.01 Tesla to 5 Tesla, although lesser and greater magnitudes of the applied magnetic field may be employed.

The nematic phase liquid crystal material that can be employed for the gate spacers (58A, 58B) can be, for example, N-(4-Methoxybenzylidene)-4-butylaniline (MBBA), cyanobiphenyls, 4-cyanobenzylidene-4'-n-octyloxyanaline (CBOOA), cyanobiphenyl (CB) dimer molecule (CB(CH2)7CB), 4,4'-Azoxyanisole, 4,4'-Azoxyanisole-d-14,4,4'-Diazido-2,2'-stilbenedisulfonic acid disodium salt tetrahydrate, N-(4-Ethoxybenzylidene)-4-butylaniline, 4'-Heptyl-4-biphenylcarbonitrile, 4'-Hexyl-4-biphenylcarbonitrile liquid crystal, 1-(trans-4-Hexylcyclohexyl)-4-isothiocyanatobenzene, 4'-(Hexyloxy)-4-biphenylcarbonitrile, 4-Isothiocyanatophenyl 4-pentylbicyclo[2.2.2]octane-1-carboxylate, N-(4-Methoxybenzylidene)-4-butylaniline, 4-Methoxycinnamic acid, predominantly trans, 4'-Octyl-4-biphenylcarbonitrile, 4'-(Octyloxy)-4-biphenylcarbonitrile, 4'-Pentyl-4-biphenylcarbonitrile, 4-(trans-4-Pentylcyclohexyl)benzonitrile, 4'-(Pentyloxy)-4-biphenylcarbonitrile, or any other nematic phase liquid crystal material known to be synthesizable in the art.

The lateral thickness lt of each gate spacer (58A, 58B) is the least lateral distance between a first vertical interface between a portion of a gate spacer (58A or 58B) in physical contact with an outer sidewall of a gate dielectric (50A or 50B) and a second vertical interface between the portion of the gate spacer (58A or 58B) and a sidewall of the planarization dielectric layer 60. The lateral thickness lt can be in a range from 5 nm to 40 nm, although lesser and greater lateral thicknesses lt can also be employed.

Once the molecules of the nematic phase liquid crystal material are aligned within the gate spacers (58A, 58B), a first value of the anisotropic dielectric constant of the anisotropic dielectric material along the vertical direction, i.e., the direction perpendicular to an interface between the body region (32A or 32B) and the gate dielectric (50A or 50B) can be greater than a second value of the anisotropic dielectric constant of the anisotropic dielectric material along a horizontal direction, i.e., a direction parallel to the interface. In one embodiment, the first value can be in a range from 7 to 25, and the second value can be in a range from 3 to 10, although each of the first and second values may be lesser or greater depending on the choice of the nematic phase liquid crystal material.

The exemplary semiconductor structure contains field effect transistors. Each field effect transistor includes a body region (32A or 32B) laterally contacted by a source region (34A or 34B) and a drain region (36A or 36B), a gate dielectric (50A or 50B) contacting the body region (32A or 32B), a gate electrode (52A or 52B) contacting the gate dielectric (50A or 50B), and a gate spacer (58A or 58B) including an anisotropic dielectric material having an anisotropic dielectric constant and laterally surrounding the gate electrode (52A or 52B). The gate spacer (58A or 58B) is in physical contact with the gate dielectric (50A or 50B). All outer sidewalls of each gate dielectric (50A or 50B) can be in physical contact with inner sidewalls of a gate spacer (58A or 58B). The planarization dielectric layer 60 has a planar top surface that is coplanar with the top surfaces of the gate spacers (58A, 58B) and the gate structures (50A, 52A, 50B, 52B). In one embodiment, each gate spacer (58A, 58B) can be in physical contact with a surface of a source region (34A or 34B) and a surface of a drain region (36A or 36B).

Figure 9:
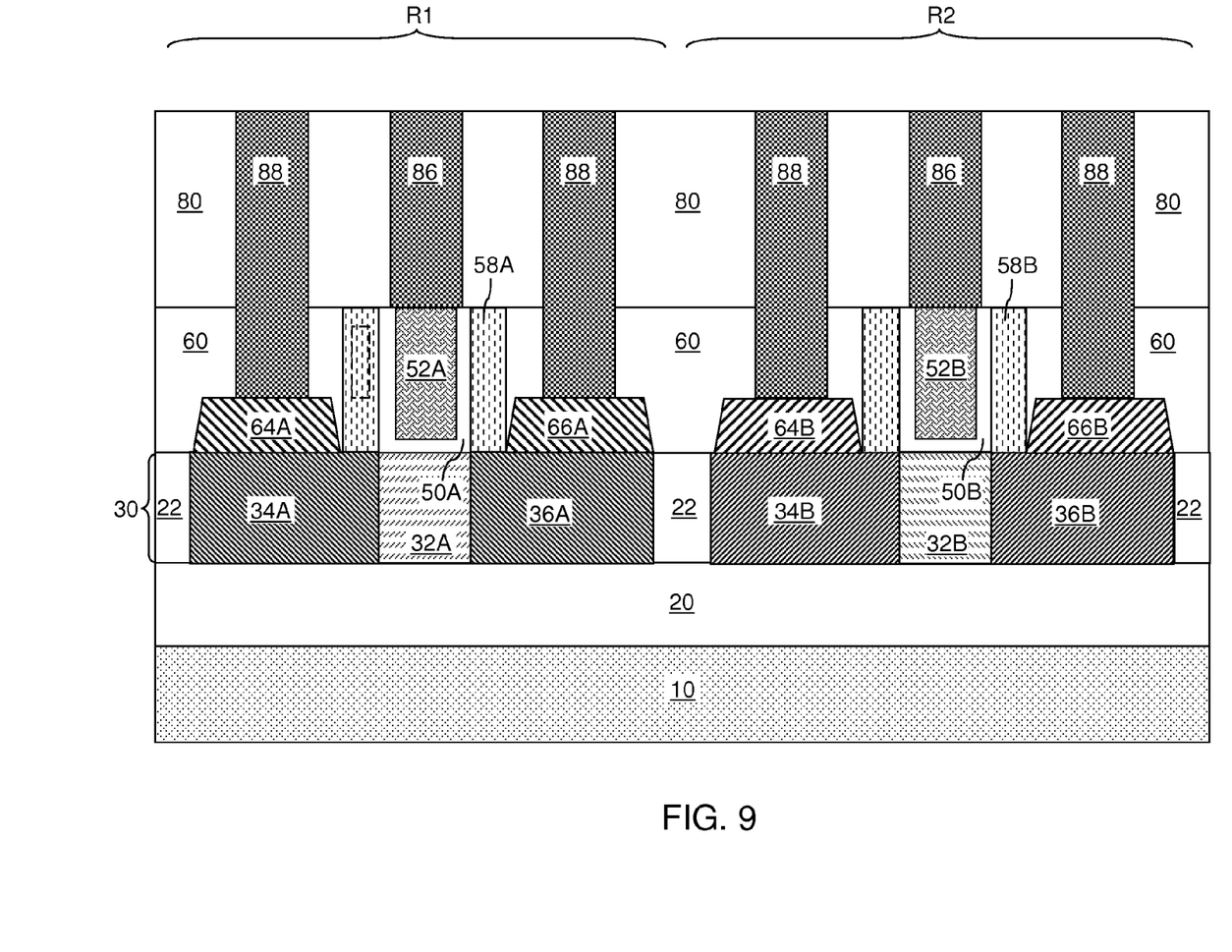
FIG. 9 is a vertical cross-sectional view of the exemplary semiconductor structure after formation of a contact level dielectric layer and various contact via structures according to an embodiment of the present disclosure.

Referring to FIG. 9, a contact-level dielectric layer 80 can be deposited over the planarization dielectric layer 60. Various contact via structures can be formed through the contact-level dielectric layer 80. The various contact via structures can include, for example, gate contact via structures 86 that extend through the contact-level dielectric layer 80 and contact one of the gate electrodes (52A, 52B), and active region contact via structures 88 that extend through a stack of the contact-level dielectric layer 80 and the planarization dielectric layer 60 and contact one of the source regions (34A, 34B) and the drain regions (36A, 36B).

The field effect transistors of the embodiments of the present disclosure can maximize the electrical channel length (for low off-state leakage) while minimizing parasitic outer fringe capacitance within a given gate pitch constraint. As field effect transistors scaled down, the gate structure, the sidewall gate spacers, and various contact via structures must fit within the scaled gate pitch. Increasing the size of a component (e.g., increase the gate length to increase the electrical channel length) necessitates a reduction in the size of one or both of the other two components.

The gate spacers of embodiments of the present disclosure exhibit dielectric anisotropy. By aligning the molecules of the nematic phase liquid crystal material such that the anisotropic dielectric material exhibits a low dielectric constant in the direction extending from a sidewall of a gate electrode to a source/drain contact via structures, and a high dielectric constant in the vertical direction, the gate sidewall fringing field coupling to underlapping source/drain extension region can be strong. The strong capacitive coupling between the gate electrode and the underlapping source/drain extension regions (which are portions of the source and drain regions that overlap with the gate spacer in a see-through top-down view) improves electrostatic integrity of the field effect transistor. The weak capacitive coupling between the gate electrode and the source/drain contact via structures and raised source/drain regions provides low parasitic outer fringing capacitance. Only a single sidewall spacer material may be employed instead of multiple dielectric materials.

While the disclosure has been described in terms of specific embodiments, it is evident in view of the foregoing description that numerous alternatives, modifications and variations will be apparent to those skilled in the art. For example, the gate spacers of the present disclosure can be employed in conjunction with a gate first integration scheme in which a permanent gate structure is formed at the processing steps of FIG. 2 instead of disposable gate structures and the processing steps of FIGS. 5 and 6 are omitted. In addition, the method of the present disclosure can be employed on a semiconductor structure including semiconductor fins to provide fin field effect transistors.

Each of the various embodiments of the present disclosure can be implemented alone, or in combination with any other embodiments of the present disclosure unless expressly disclosed otherwise or otherwise impossible as would be known to one of ordinary skill in the art. Accordingly, the disclosure is intended to encompass all such alternatives, modifications and variations which fall within the scope and spirit of the disclosure and the following claims.

What is claimed is:

1. A method of forming a semiconductor structure comprising:
   forming a disposable gate spacer on opposite sidewalls of a gate structure located on a body portion of a semiconductor material portion of a substrate;
   replacing said disposable gate spacer with a gate spacer comprising an anisotropic dielectric material having an anisotropic dielectric constant, said gate spacer laterally surrounding said gate structure, wherein said anisotropic dielectric material is a nematic phase liquid crystal material;
   aligning lengthwise directions of molecules of said nematic liquid crystal material along a vertical direction perpendicular to an interface between said body portion and a gate dielectric, wherein a first value of said anisotropic dielectric constant of said nematic phase liquid crystal material along said vertical direction perpendicular to said interface between said body portion and said gate dielectric is greater than a second value of said anisotropic dielectric constant of said nematic phase liquid crystal material along a direction parallel to said interface upon alignment of the molecules of said nematic phase liquid crystal material of said gate spacer.

2. The method of claim 1, wherein said nematic phase liquid crystal material comprises N-(4-Methoxybenzylidene)-4-butylaniline (MBBA), cyanobiphenyls, 4-cyanobenzylidene-4'-n-octyloxyanaline (CBOOA), cyanobiphenyl (CB) dimer molecule (CB(CH2)7CB), 4,4'-Azoxyanisole, 4,4'-Azoxyanisole-d14,4,4'-Diazido-2,2'-stilbenedisulfonic acid disodium salt tetrahydrate, N-(4-Ethoxybenzylidene)-4-butylaniline, 4'-Heptyl-4-biphenylcarbonitrile, 4'-Hexyl-4-biphenylcarbonitrile liquid crystal, 1-(trans-4-Hexylcyclohexyl)-4-isothiocyanatobenzene, 4'-(Hexyloxy)-4-biphenylcarbonitrile, 4-Isothiocyanatophenyl 4-pentylbicyclo[2.2.2]octane-1-carboxylate, N-(4-Methoxybenzylidene)-4-butylaniline, 4-Methoxycinnamic acid, predominantly trans, 4'-Octyl-4-biphenylcarbonitrile, 4'-(Octyloxy)-4-biphenylcarbonitrile, 4'-Pentyl-4-biphenylcarbonitrile, or 4-(trans-4-Pentylcyclohexyl) benzonitrile, 4'-(Pentyloxy)-4-biphenylcarbonitrile.

3. The method of claim 1, wherein said aligning of said lengthwise directions of molecules of said liquid crystal material is performed by applying an electrical field or a magnetic field to said molecules of said liquid crystal along said vertical direction.

4. The method of claim 3, wherein said electric field has a magnitude ranging from $10^5$ V/cm to $10^7$ V/cm.

5. The method of claim 3, wherein said magnetic field has a magnitude ranging from 0.01 Tesla to 5 Tesla.

6. The method of claim 1, wherein said disposable gate spacer comprises a dielectric material, a semiconductor material, or a metallic material.

7. The method of claim 1, further comprising forming a source region and a drain region within said semiconductor material portion of said substrate by an ion implantation process prior to said forming said disposable gate spacer, said source region and said drain region laterally spaced from each other by said body region.

8. The method of claim 7, further comprising forming a raised source region over said source region and a raised drain region over said drain region by selective epitaxy.

9. The method of claim 8, further comprising:
forming a planarization dielectric layer comprising an isotropic dielectric material over said gate structure, said disposable gate spacer, said raise source region and said raised drain region, wherein a top surface of said planarization dielectric layer is coplanar with a top surface of said disposable gate spacer.

10. The method of claim 1, wherein said replacing said disposable gate spacer with said gate spacer comprises:
forming a gate spacer cavity by removing said disposable gate spacer; and
pouring said anisotropic dielectric material in a liquid phase into said gate spacer cavity.

11. The method of claim 10, wherein said removing said disposable gate spacer is performed by an isotropic etch or an anisotropic etch.

12. The method of claim 10, wherein an electrical field or a magnetic field is applied during said pouring said anisotropic dielectric material or after said pouring said anisotropic dielectric material.

13. The method of claim 1, wherein said gate structure comprises a gate dielectric in contact with said body portion and a gate electrode over said gate dielectric.

14. The method of claim 1, wherein said gate structure is a disposable gate structure formed by:
forming a disposable gate dielectric layer on a top surface of said substrate;
forming a disposable gate material layer over said disposable gate dielectric layer; and
patterning said disposable gate dielectric layer and said disposable gate material layer.

15. The method of claim 14, further comprising removing said disposable gate structure to provide a gate cavity after forming a planarization dielectric layer, wherein said gate cavity laterally surrounded by said disposable gate spacer.

16. The method of claim 15, further comprising forming a permanent gate structure within said gate cavity, said permanent gate structure comprises a gate dielectric located on a bottom surface and sidewalls of said gate cavity and a gate electrode filling a remaining volume of said gate cavity.

17. The method of claim 1, wherein said first value of said anisotropic dielectric constant is from 7 to 25, and said second value of said anisotropic dielectric constant is from 3 to 10.

\* \* \* \* \*